US011359139B2

(12) United States Patent
Takeda et al.

(10) Patent No.: US 11,359,139 B2
(45) Date of Patent: Jun. 14, 2022

(54) PHOSPHOR POWDER, COMPOSITE, AND LIGHT-EMITTING DEVICE

(71) Applicant: DENKA COMPANY LIMITED, Tokyo (JP)

(72) Inventors: Yusuke Takeda, Tokyo (JP); Tomohiro Nomiyama, Tokyo (JP); Marina Takamura, Tokyo (JP); Tatsuya Okuzono, Tokyo (JP); Masaru Miyazaki, Tokyo (JP); Shintaro Watanabe, Tokyo (JP)

(73) Assignee: DENKA COMPANY LIMITED, Tokyo (JP)

(*) Notice: Subject to any disclaimer, the term of this patent is extended or adjusted under 35 U.S.C. 154(b) by 0 days.

(21) Appl. No.: 17/598,438

(22) PCT Filed: Mar. 24, 2020

(86) PCT No.: PCT/JP2020/013109
§ 371 (c)(1),
(2) Date: Sep. 27, 2021

(87) PCT Pub. No.: WO2020/203488
PCT Pub. Date: Oct. 8, 2020

(65) Prior Publication Data
US 2022/0089945 A1 Mar. 24, 2022

(30) Foreign Application Priority Data
Mar. 29, 2019 (JP) .............................. JP2019-069116

(51) Int. Cl.
H01L 33/00 (2010.01)
H01L 33/62 (2010.01)
(Continued)

(52) U.S. Cl.
CPC ...... *C09K 11/77348* (2021.01); *H01L 33/502* (2013.01)

(58) Field of Classification Search
CPC ..................... C09K 11/77348; H01L 33/502
See application file for complete search history.

(56) References Cited

U.S. PATENT DOCUMENTS 8,491,816 B2  7/2013  Hong et al.
9,464,226 B2  10/2016  Sakata et al.
(Continued)

FOREIGN PATENT DOCUMENTS

CN    105073948 A    11/2015
CN    105247011 A    1/2016
(Continued)

OTHER PUBLICATIONS

Jun. 9, 2020 International Search Report issued in International Patent Application No. PCT/JP2020/013109.
(Continued)

*Primary Examiner* — Tracie Y Green
(74) *Attorney, Agent, or Firm* — Oliff PLC

(57) ABSTRACT

A phosphor powder composed of α-sialon phosphor particles containing Eu. With regard to the phosphor powder, a volume-based median diameter ($D_{50}$) determined by a laser diffraction scattering method is equal to or more than 10 μm and equal to or less than 20 μm, and a diffuse reflectance with respect to light at a wavelength of 600 nm is equal to or more than 93% and equal to or less than 99%.

13 Claims, 2 Drawing Sheets

(51) Int. Cl.
*C09K 11/77* (2006.01)
*H01L 33/50* (2010.01)

(56) References Cited

U.S. PATENT DOCUMENTS

| | | | |
|---|---|---|---|
| 9,541,238 B2 | 1/2017 | Hong et al. | |
| 9,570,655 B2 | 2/2017 | Yoshimura et al. | |
| 9,711,686 B2 | 7/2017 | Yoshimura et al. | |
| 10,011,769 B2 | 7/2018 | Hong et al. | |
| 10,093,854 B2 | 10/2018 | Toyoshima et al. | |
| 10,125,313 B2 | 11/2018 | Sumino et al. | |
| 10,266,766 B2 | 4/2019 | Emoto | |
| 10,385,267 B2 | 8/2019 | Morikawa et al. | |
| 10,858,582 B2 | 12/2020 | Hong et al. | |
| 2010/0142189 A1 | 6/2010 | Hong et al. | |
| 2011/0133629 A1 | 6/2011 | Sakata et al. | |
| 2012/0261703 A1* | 10/2012 | Zimmerman | H01L 33/641 |
| | | | 257/98 |
| 2013/0271960 A1 | 10/2013 | Hong et al. | |
| 2013/0285104 A1 | 10/2013 | Yoshimura et al. | |
| 2014/0197362 A1 | 7/2014 | Sakata et al. | |
| 2014/0299902 A1* | 10/2014 | Zimmerman | H01L 33/62 |
| | | | 257/98 |
| 2016/0060516 A1 | 3/2016 | Sumino et al. | |
| 2016/0122642 A1 | 5/2016 | Sumino et al. | |
| 2016/0204311 A1 | 7/2016 | Yoshimura et al. | |
| 2016/0280994 A1 | 9/2016 | Emoto | |
| 2017/0158957 A1 | 6/2017 | Hong et al. | |
| 2017/0166810 A1 | 6/2017 | Morikawa et al. | |
| 2017/0174986 A1 | 6/2017 | Sumino et al. | |
| 2018/0163128 A1 | 6/2018 | Toyoshima et al. | |
| 2018/0273842 A1 | 9/2018 | Hong et al. | |
| 2019/0330528 A1 | 10/2019 | Morikawa et al. | |
| 2021/0062085 A1 | 3/2021 | Hong et al. | |

FOREIGN PATENT DOCUMENTS

| | | |
|---|---|---|
| CN | 105980524 A | 9/2016 |
| JP | 2005-272486 A | 10/2005 |
| JP | 2006-269938 A | 10/2006 |
| JP | 2009-096882 A | 5/2009 |
| JP | 2010-209311 A | 9/2010 |
| JP | 2017-110206 A | 6/2017 |
| JP | 2018-109083 A | 7/2018 |
| JP | 2018-178129 A | 11/2018 |
| JP | 2018-197355 A | 12/2018 |
| JP | 2019-001986 A | 1/2019 |
| WO | 2010/018873 A1 | 2/2010 |
| WO | 2012/098932 A1 | 7/2012 |
| WO | 2014/077240 A1 | 5/2014 |
| WO | 2015/098814 A1 | 7/2015 |

OTHER PUBLICATIONS

Feb. 11, 2022 Office Action issued in German Patent Application No. 112020001611.0.
Piao et al., "Synthesis and luminescent properties of low oxygen contained Eu2+-doped Ca-α-SiAlON phosphor from calcium cyanamide reduction," Journal of Rare Earths, vol. 26, No. 2, Apr. 2008, pp. 198-202.
Mar. 30, 2022 Office Action issued in Chinese Patent Application No. 202080025140.8.

* cited by examiner

PHOSPHOR POWDER, COMPOSITE, AND LIGHT-EMITTING DEVICE

TECHNICAL FIELD

The present invention relates to a phosphor powder, a composite, and a light-emitting device.

BACKGROUND ART

As nitride and oxynitride phosphors, an α-sialon phosphor in which a specific rare earth element is activated is known to have useful fluorescence characteristics, and has been applied to a white LED and the like. The α-sialon phosphor has a structure in which Si—N bonds of α-silicon nitride crystals are partially substituted with Al—N bonds and Al—O bonds, and specific elements (Ca, Li, Mg, Y, or lanthanide metals except for La and Ce) penetrate into crystal lattices and are solid-dissolved in order to maintain electrical neutrality. The fluorescence characteristics are expressed by using some of the elements that penetrate into the lattices and are solid-dissolved as a rare earth element serving as a luminescent center. Among those, the α-sialon phosphor, in which Ca is solid-dissolved and the elements are partially substituted with Eu, is relatively efficiently excited in a wide wavelength range from ultraviolet to blue light and exhibits emission of yellow to orange light. As an attempt to further improve the fluorescence characteristics of such an α-sialon phosphor, for example, it has been proposed to select an α-sialon phosphor having a specific average particle diameter by a classification treatment (Patent Document 1).

RELATED DOCUMENT

Patent Document

[Patent Document 1] Japanese Laid-open Patent Publication No. 2009-96882

SUMMARY OF THE INVENTION

Technical Problem

In recent years, a higher brightness of a white LED has been demanded. For example, a further improvement in the light emission characteristics of a phosphor powder used for the white LED has also been required.

The present invention has been made in view of the problems. An object of the present invention is to provide a phosphor powder having improved light emission characteristics.

Solution to Problem

According to the present invention, there is provided:
a phosphor powder composed of α-sialon phosphor particles containing Eu,
in which a volume-based median diameter ($D_{50}$) determined by a laser diffraction scattering method is equal to or more than 10 μm and equal to or less than 20 μm, and a diffuse reflectance with respect to light at a wavelength of 600 nm is equal to or more than 93% and equal to or less than 99%.

Furthermore, according to the present invention, there is also provided a composite including the above-mentioned phosphor powder and a sealing material that seals the phosphor powder.

In addition, according to the present invention, there is provided a light-emitting device including a light-emitting element that emits excitation light, and the above-mentioned composite that converts a wavelength of the excitation light.

Advantageous Effects of Invention

According to the present invention, it is possible to provide a technique relating to a phosphor powder having improved light emission characteristics.

DESCRIPTION OF EMBODIMENTS

Figure 1:
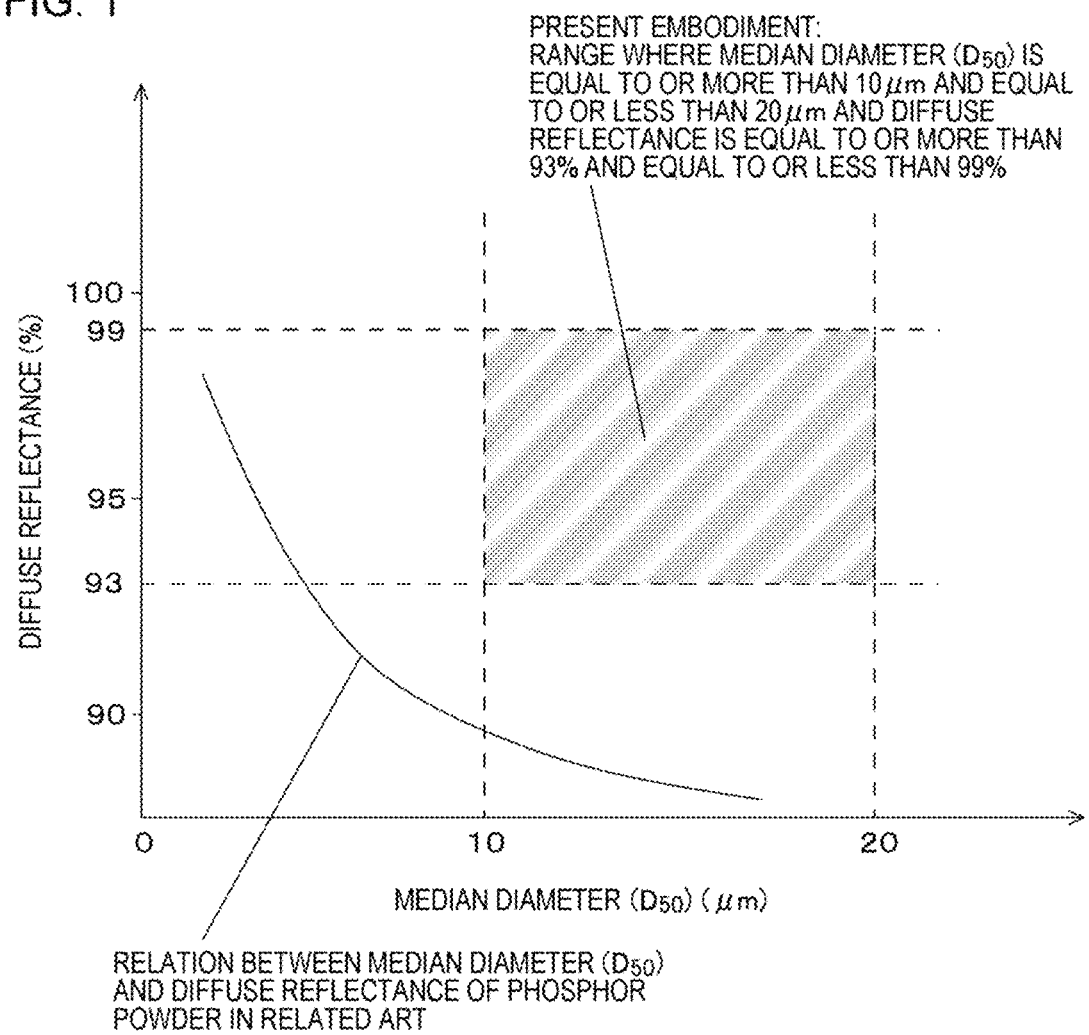
FIG. 1 shows a conceptual view which shows a relationship between a median diameter ($D_{50}$) and a diffuse reflectance with respect to light at a wavelength of 600 nm for a phosphor powder in the related art, and ranges of a median diameter ($D_{50}$) and a diffuse reflectance with respect to light at a wavelength of 600 nm, each defined for a phosphor powder of the present embodiment.

Hereinafter, embodiments of the present invention will be described in detail.

The phosphor powder according to the embodiment is a phosphor powder composed of α-sialon phosphor particles containing Eu. With regard to the phosphor powder, a volume-based median diameter ($D_{50}$) determined by a laser diffraction scattering method is equal to or more than 10 μm and equal to or less than 20 μm, and a diffuse reflectance with respect to light at a wavelength of 600 nm is equal to or more than 93% and equal to or less than 99%.

With the phosphor powder of the present embodiment, it is possible to improve the fluorescence characteristics of α-sialon phosphor particles in the related art while holding the excitation wavelength range and the fluorescence wavelength range of the α-sialon phosphor particles. Therefore, as a result, it is possible to improve the light emission characteristics of a light-emitting device using the phosphor powder of the present embodiment.

Detailed mechanism as a reason therefor is not clear, but is considered to be as follows: it is possible to improve the fluorescence characteristics of the phosphor powder by achieving both a median diameter in the range of equal to or more than 10 μm and equal to or less than 20 μm and a diffuse reflectance with respect to light at a wavelength of 600 nm of equal to or more than 93% and equal to or less than 99%.

(α-Sialon Phosphor Particles)

The α-sialon phosphor particles containing Eu are composed of an α-sialon phosphor which will be described below.

The α-sialon phosphor is an α-sialon phosphor containing an Eu element, represented by General Formula: (M1$_x$, M2$_y$, Eu$_z$) (Si$_{12-(m+n)}$Al$_{m+n}$) (O$_n$N$_{16-n}$) (provided that M1 is a monovalent Li element and M2 are one or more divalent elements selected from the group consisting of Mg, Ca, and lanthanide elements (except for La and Ce)).

The solid dissolution composition of the α-sialon phosphor is expressed in x, y, and z in the general formula, and m and n determined by an Si/Al ratio and an O/N ratio associated therewith, and satisfies 0≤x<2.0, 0≤y<2.0, 0<z≤0.5, 0<x+y, 0.3≤x+y+z≤2.0, 0<m≤4.0, and 0<n≤3.0. In particular, in a case where Ca is used as M2, the α-sialon phosphor is stabilized in a wide composition range, and by partially substituting the elements of Ca with Eu serving as a luminescent center, excitation occurs by light in a wide wavelength range from ultraviolet to blue light, whereby a phosphor exhibiting emission of visible light ranging from yellow to orange light can be obtained.

In addition, from the viewpoint of obtaining light in bulb color in illumination applications, it is preferable that the α-sialon phosphor includes no Li or a small amount of L, if any, as the solid dissolution composition. In terms of the general formula, it is preferable to satisfy $0 \leq x \leq 0.1$. Furthermore or alternatively, a ratio of Li in the α-sialon phosphor is preferably equal to or more than 0% by mass and equal to or less than 1% by mass.

In general, the α-sialon phosphor has a second crystal phase different from that of the α-sialon phosphor or an amorphous phase which is inevitably present, the solid dissolution composition cannot be strictly defined by composition analysis or the like. As a crystal phase of the α-sialon phosphor, an α-sialon single phase is preferable, and the α-sialon phosphor may also include aluminum nitride or a polytypoid or the like thereof as another crystal phase.

In the α-sialon phosphor particles, a plurality of equi-axed primary particles are sintered to form aggregated secondary particles. The primary particles in the present embodiment refer to the smallest particles observable with an electron microscope or the like, in which the particles can exist singly. The shape of the α-sialon phosphor particle is not particularly limited. Examples of the shape include a spherical shape, a cubic shape, a columnar shape, and an amorphous shape.

The median diameter ($D_{50}$) of the phosphor powder of the present embodiment is equal to or more than 10 μm, and more preferably equal to or more than 12 μm. In addition, the upper limit of the median diameter ($D_{50}$) of the phosphor powder of the present embodiment is equal to or less than 20 μm, and more preferably equal to or less than 18 μm. The median diameter ($D_{50}$) of the phosphor powder of the present embodiment is a dimension for the secondary particles.

Here, the median diameter ($D_{50}$) of the phosphor powder means a 50% diameter in a volume-based integrated fraction, determined by a laser diffraction scattering method in accordance with JIS R1629: 1997.

The phosphor particles of the present embodiment satisfy the condition that the median diameter ($D_{50}$) is in the range and the diffuse reflectance with respect to light at a wavelength of 600 nm is equal to or more than 93% and equal to or less than 99%. The diffuse reflectance can be measured by an ultraviolet-visible spectrophotometer equipped with an integrating sphere device. Further, the diffuse reflectance with respect to light at a wavelength of 600 nm is preferably equal to or more than 94% and equal to or less than 99%, and more preferably equal to or more than 94% and equal to or less than 96% from the viewpoint of further improving the light emission characteristics.

FIG. 1 shows a conceptual view which shows a relationship between the median diameter ($D_{50}$) and the diffuse reflectance with respect to light at a wavelength of 600 nm in a phosphor powder in the related art, and the ranges of the median diameter ($D_{50}$) and the diffuse reflectance with respect to light at a wavelength of 600 nm, each defined for the phosphor powder of the present embodiment.

According to knowledge that has been accumulated so far on the α-sialon phosphor, in a case where a diffuse reflectance with respect to light at a wavelength of 600 nm with respect to a median diameter ($D_{50}$) is plotted in FIG. 1, it is located near the curve shown in FIG. 1 with regard to an α-sialon phosphor powder in the related art. In contrast, with regard to the phosphor powder of the present embodiment, it was found that the light emission characteristics can be improved by optimizing a method for producing the phosphor powder which will be described later, thus to adjust the diffuse reflectance to a range of equal to or more than 93% and equal to or less than 99%, which is higher than that for the phosphor powder in the related art, in the median diameter ($D_{50}$) range of equal to or more than 10 μm and equal to or less than 20 μm.

Moreover, in the phosphor powder of the present embodiment, the light emission characteristics can be further improved by satisfying at least one of the following conditions while setting each of the median diameter ($D_{50}$) and the diffuse reflectance in the above-mentioned predetermined range.

(i) In a case where a volume-based cumulative 10% diameter and a volume-based cumulative 90% diameter as measured by a laser diffraction scattering method are defined as $D_{10}$ and $D_{90}$, respectively, $(D_{90}-D_{10})/D_{50}$ is equal to or more than 1.0 and equal to or less than 1.5.

(ii) A diffuse reflectance with respect to light at a wavelength of 500 nm is equal to or more than 66% and equal to or less than 80%.

(iii) A difference (X1−X2) between a diffuse reflectance X1(%) with respect to light at a wavelength of 800 nm and a diffuse reflectance X2(%) with respect to light at a wavelength of 600 nm is equal to or less than 3.0(%).

With the above-mentioned phosphor powder of the present embodiment, it is possible to promote an improvement of the fluorescence characteristics by setting the volume-based median diameter ($D_{50}$) determined by a laser diffraction scattering method to a range of equal to or more than 10 μm and equal to or less than 20 μm and setting a diffuse reflectance with respect to light at a wavelength of 600 nm to a range of equal to or more than 93% and equal to or less than 99%.

(Method for Producing Phosphor Powder)

A method for producing a phosphor powder composed of the α-sialon phosphor particles of the present embodiment will be described. In the α-sialon phosphor particles, apart of a raw material powder mainly undergoes a reaction to form a liquid phase, and each of the elements moves through the liquid phase in the synthesis process, whereby formation of a solid solution and grain growth proceed.

First, the raw materials including the elements constituting the α-sialon phosphor particles containing Eu are mixed. Specifically, calcium is dissolved at a high concentration in α-sialon phosphor particles having a low oxygen content, synthesized by using calcium nitride as a calcium raw material, to form a solid solution. In particular, in a case where the Ca solid dissolution concentration is high, it is possible to obtain a phosphor having a light emission peak wavelength on a higher wavelength side (equal to or more than 590 nm, more specifically equal to or more than 590 nm and equal to or less than 610 nm, and still more specifically equal to or more than 592 nm and equal to or less than 608 nm) than that of a composition in the related art, using an oxide raw material. Specifically, in the general formula, it is preferable to satisfy $1.5<x+y+z\leq 2.0$. It is also possible to finely tune the emission spectrum by partially substituting the elements of Ca with Li, Mg, Sr, Ba, Y, and lanthanide elements (except for La and Ce).

Examples of a raw material powder other than those include silicon nitride, aluminum nitride, and an Eu compound. Examples of the Eu compound include europium oxide, a compound that turns into europium oxide after heating, and europium nitride. Europium nitride, which can reduce the amount of oxygen in the system, is preferable.

In a case where an appropriate amount of the α-sialon phosphor particles previously synthesized is added to a raw material powder, this addition can serve as a base point of the grain growth to obtain α-sialon phosphor particles having relatively short-axis diameters, and the particle shapes can be controlled by changing the forms of the α-sialon particles to be added.

Examples of a method of mixing the above-mentioned respective raw materials include a dry mixing method and a method in which wet mixing is performed in an inert solvent that does not substantially react with the respective components of the raw materials, and then the solvent is removed. Examples of a mixing device include a V type mixer, a rocking mixer, a ball mill, and a vibrating mill. Mixing of calcium nitride which is unstable in the atmosphere is preferably performed in a glove box in an inert atmosphere since the hydrolysis and the oxidation of the substance give an influence on the characteristics of a synthetic product.

A container made of a material having a low reactivity with a raw material and a phosphor to be synthesized, for example, a container made of boron nitride is filled with a powder obtained by mixing (hereinafter simply referred to as a raw material powder). Then, the powder is heated for a predetermined time in a nitrogen atmosphere. In this manner, an α-sialon phosphor can be obtained. A temperature for the heat treatment is preferably equal to or higher than 1,650° C. and equal to or lower than 1,950° C.

By setting the temperature for the heat treatment to equal to or higher than 1,650° C., it is possible to reduce the amount of residual unreacted products and make the primary particles sufficiently grow. In addition, by setting the temperature to equal to or lower than 1,950° C., it is possible to suppress remarkable sintering between the particles.

From the viewpoint of suppressing sintering between the particles during the heating, it is preferable that the container is filled with an increased volume of the raw material powder. Specifically, it is preferable that a bulk density at the time of filling the raw material powder in the container is set to equal to or less than 0.6 g/cm$^3$.

The heating time for the heat treatment is preferably equal to or more than 2 hours and equal to or less than 24 hours in terms of a time range during which there are no inconveniences such as presence of a large amount of residual unreacted substances, insufficient growth of primary particles, and sintering between the particles.

In the above-mentioned step, an α-sialon phosphor having an ingot-shaped outer form is produced. By subjecting this ingot-shaped α-sialon phosphor to a pulverizing step in which the phosphor is pulverized by a pulverizer such as a crusher, a mortar pulverizer, a ball mill, a vibrating mill, and a jet mill, and a sieve classification step after such the pulverizing treatment, it is possible to obtain a phosphor powder composed of α-sialon phosphor particles having an adjusted $D_{50}$ particle diameter of secondary particles. In addition, it is possible to adjust the $D_{50}$ particle diameter of the secondary particles by performing a step in which the phosphor powder is dispersed in an aqueous solution to remove the secondary particles that have small particle diameters and are hardly settled.

The phosphor powder composed of the α-sialon phosphor particles according to the embodiment can be manufactured by carrying out the above-mentioned steps and then carrying out an acid treatment step.

In the acid treatment step, for example, the α-sialon phosphor particles are immersed in an acidic aqueous solution. Examples of the acidic aqueous solution include an acidic aqueous solution including one kind of acid selected from acids such as hydrofluoric acid, nitric acid, and hydrochloric acid, and an aqueous mixed acid solution obtained by mixing two or more kinds of the acids. Among these, an aqueous hydrofluoric acid solution including hydrofluoric acid alone and an aqueous mixed acid solution obtained by mixing hydrofluoric acid and nitric acid are more preferable. The stock solution concentration of the acidic aqueous solution is appropriately set depending on the strength of an acid used, but is, for example, preferably equal to or more than 0.7% and equal to or less than 100%, and more preferably equal to or more than 0.7% and equal to or less than 40%. In addition, a temperature at which the acid treatment is carried out is preferably equal to or higher than 25° C. and equal to or lower than 90° C., and more preferably equal to or higher than 60° C. and equal to or lower than 90° C., and the reaction time (immersion time) is preferably equal to or more than 15 minutes and equal to or less than 80 minutes.

In the acid treatment step, it is preferable to stir the acidic aqueous solution at a high speed. The acid treatment is likely to be sufficiently performed by high-speed stirring. The term "high speed" as used herein depends on a stirring device used, but in a case where a laboratory-level magnetic stirrer is used, the stirring speed is, for example, equal to or more than 400 rpm, and in reality, equal to or more than 400 rpm and equal to or less than 500 rpm.

For a usual purpose of stirring, which is to constantly supply a new acid to a particle surface, it is considered that a stirring speed of about 200 rpm is sufficient. However, according to the knowledge of the present inventors, in the present embodiment, the particle surface is treated by a physical action in addition to a chemical action, probably by performing high-speed stirring at equal to or more than 400 rpm. Then, it is considered that a phosphor powder having a diffuse reflectance of equal to or more than 93% and equal to or less than 99% with respect to light at a wavelength of 600 nm is thus more easily obtained.

The median diameter ($D_{50}$) of the phosphor powder and the diffuse reflectance with respect to light at a wavelength of 600 nm can be controlled by optimally adjusting a degree of pulverization in the pulverizing step, an opening of a sieve used in the sieve classification step, a stock solution concentration of the acidic aqueous solution used for the acid treatment, a temperature during the acid treatment, a reaction time, and the like. For example, by adopting conditions which approximate to a combination of the conditions of the pulverizing step and the sieve classification step, the stock solution concentration of the acidic aqueous solution, a temperature of the acid treatment, and a reaction time, with reference to abundant Examples which will be described below, thus to carry out the acid treatment, it is possible to set the median diameter ($D_{50}$) and the diffuse reflectance with respect to light at a wavelength of 600 nm of the phosphor powder to desired values.

(Composite)

The composite according to an embodiment includes the above-mentioned phosphor particles and a sealing material that seals the phosphor particles. In the composite according to the present embodiment, a plurality of the above-mentioned phosphor particles are dispersed in the sealing material. As the sealing material, a well-known material such as a resin, a glass, and ceramics can be used. Examples of the resin used for the sealing material include transparent resins such as a silicone resin, an epoxy resin, and a urethane resin.

Examples of a method for manufacturing the composite include a manufacturing method in which a powder composed of α-sialon phosphor particles of the present embodiment is added to a liquid resin, a powdered glass, or ceramics, and the mixture is mixed uniformly, and then cured or sintered by a heat treatment.

(Light-Emitting Device)

Figure 2:
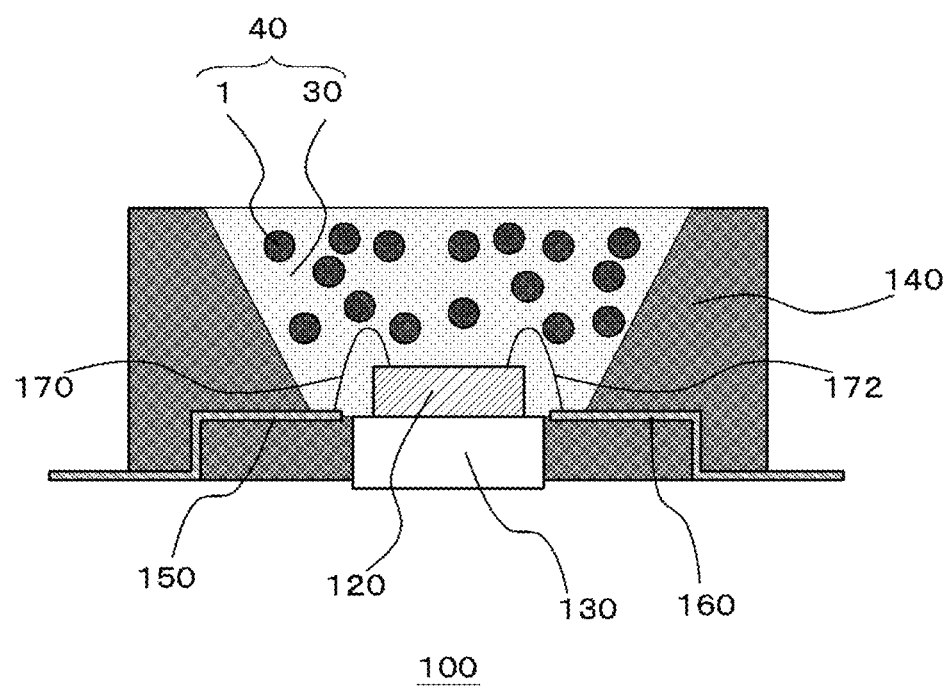
FIG. 2 is a schematic cross-sectional view showing a structure of a light-emitting device according to an embodiment.

FIG. 2 is a schematic cross-sectional view showing a structure of a light-emitting device according to the present embodiment. As shown in FIG. 2, a light-emitting device 100 includes a light-emitting element 120, a heat sink 130, a case 140, a first lead frame 150, a second lead frame 160, a bonding wire 170, a bonding wire 172, and a composite 40.

The light-emitting element 120 is mounted in a predetermined region on the upper surface of the heat sink 130. By mounting the light-emitting element 120 on the heat sink 130, the heat dissipation of the light-emitting element 120 can be enhanced. Further, a packaging substrate may be used instead of the heat sink 130.

The light-emitting element 120 is a semiconductor element that emits excitation light. As the light-emitting element 120, for example, an LED chip that generates light at a wavelength of equal to or more than 300 nm and equal to or less than 500 nm, corresponding to near-ultraviolet to blue light, can be used. One electrode (not shown in the drawings) arranged on the upper surface side of the light-emitting element 120 is connected to the surface of the first lead frame 150 through the bonding wire 170 such as a gold wire. In addition, the other electrode (not shown in the drawings) formed on the upper surface of the light-emitting element 120 is connected to the surface of the second lead frame 160 through the bonding wire 172 such as a gold wire.

In the case 140, a substantially funnel-shaped recess whose hole diameter gradually increases toward the upside from the bottom surface is formed. The light-emitting element 120 is provided on the bottom surface of the recess. The wall surface of the recess surrounding the light-emitting element 120 serves as a reflective plate.

The recess whose wall surface is formed by the case 140 is filled with the composite 40. The composite 40 is a wavelength conversion member that converts excitation light emitted from the light-emitting element 120 into light at a longer wavelength. The composite of the present embodiment is used as the composite 40, and α-sialon phosphor particles 1 of the present embodiment are dispersed in a sealing material 30 such as a resin. The light-emitting device 100 emits a mixed color of light of the light-emitting element 120 and light generated from the α-sialon phosphor particles 1 which are excited by absorbing the light of the light-emitting element 120. The light-emitting device 100 preferably emits white light by the mixed color of the light of the light-emitting element 120 and the light generated from the α-sialon phosphor particles 1.

In the light-emitting device 100 of the present embodiment, by making a phosphor powder composed of the α-sialon phosphor particles 1 satisfy both a condition that a volume-based median diameter ($D_{50}$) determined by a laser diffraction scattering method is equal to or more than 10 μm and equal to or less than 20 μm and a condition that a diffuse reflectance with respect to light at a wavelength of 600 nm is equal to or more than 93% and equal to or less than 99% as mentioned above, it is possible to improve the fluorescence characteristics of the α-sialon phosphor particles 1 and the composite 40 can be improved, and it is also possible to promote an improvement of the light emission intensity of the light-emitting device 100.

In FIG. 2, a surface mounting type light-emitting device is illustrated, but the light-emitting device is not limited to the surface mounting type device. The light-emitting device may be of a cannonball type, a chip-on-board (COB) type, or a chip-scale-package (CSP) type.

The embodiments of the present invention have been described above, but these are examples of the present invention and various configurations other than the examples can also be adopted.

EXAMPLES

Hereinafter, the present invention will be described with reference to Examples and Comparative Examples, but the present invention is not limited thereto.

Example 1

In a glove box, 62.4 parts by mass of a silicon nitride powder (manufactured by Ube Kosan Co., Ltd., E10 grade), 22.5 parts by mass of an aluminum nitride powder (manufactured by Tokuyama Corporation, E grade), 2.2 parts by mass of an europium oxide powder (manufactured by Shin-Etsu Chemical Co., Ltd., RU grade), and 12.9 parts by mass of a calcium nitride powder (manufactured by Kojundo Chemical Lab. Co., Ltd.) were used as a blend composition of a raw material powder, and the raw material powders were dry-blended and then passed through a nylon-made sieve having an opening of 250 μm to obtain a raw material mixed powder. A cylindrical boron nitride-made container (manufactured by Denka Co., Ltd., N-1 grade) with a lid, having an internal volume of 0.4 liters, is filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and completely passed through a sieve having an opening of 150 μm to obtain a phosphor powder. With regard to this phosphor powder, the crystal phase was examined by powder X-ray diffraction measurement (X-ray Diffraction) using CuKα rays, and thus, the existing crystal phase was a Ca-α-sialon (α-sialon including Ca) containing an Eu element.

Next, 3.2 ml of 50% hydrofluoric acid and 0.8 ml of 70% nitric acid were mixed to obtain a mixed stock solution. 396 ml of distilled water was added to the mixed stock solution, and the concentration of the mixed stock solution was diluted to 1.0% to prepare 400 ml of an aqueous mixed acid solution. 30 g of a phosphor powder composed of the above-mentioned α-sialon phosphor particles was added to the aqueous mixed acid solution, the temperature of the aqueous mixed acid solution was kept at 80° C., and the mixture was subjected to an acid treatment in which the mixture was immersed for 30 minutes under stirring at a rotation speed of 450 rpm using a magnetic stirrer. The powder after the acid treatment was thoroughly washed with distilled water, filtered, dried, and then passed through a sieve having an opening of 45 μm to manufacture a phosphor powder composed of the α-sialon phosphor particles of Example 1.

Example 2

A phosphor powder composed of α-sialon phosphor particles of Example 2 was manufactured by the same procedure as in Example 1, except that an aqueous mixed acid solution having a stock solution concentration of 1.0% was prepared by adding 396 ml of distilled water to a mixed stock solution obtained by mixing 1.2 ml of 50% hydrofluoric acid and 2.8 ml of 70% nitric acid, instead of the aqueous mixed acid solution used in Example 1.

Example 3

A phosphor powder composed of α-sialon phosphor particles of Example 3 was manufactured by the same procedure as in Example 1, except that an aqueous mixed acid solution having a stock solution concentration of 5.0% was prepared by adding 380 ml of distilled water to a mixed stock solution obtained by mixing 10 ml of 50% hydrofluoric acid and 10 ml of 70% nitric acid, instead of the aqueous mixed acid solution used in Example 1, and the phosphor powder was immersed for 30 minutes while the temperature of the aqueous mixed acid solution was kept at 30° C.

Example 4

A phosphor powder composed of α-sialon phosphor particles of Example 4 was manufactured by the same procedure as in Example 1, except that an aqueous mixed acid solution having a stock solution concentration of 25% was prepared by adding 300 ml of distilled water to a mixed stock solution obtained by mixing 50 ml of 50% hydrofluoric acid and 50 ml of 70% nitric acid, instead of the aqueous mixed acid solution used in Example 1, and the phosphor powder was immersed for 60 minutes while the temperature of the aqueous mixed acid solution was kept at 80° C.

Comparative Example 1

A phosphor powder composed of α-sialon phosphor particles of Comparative Example 1 was manufactured by the same procedure as in Example 1, except that an aqueous mixed acid solution having a stock solution concentration of 0.5% was used by adding 398 ml of distilled water to a mixed stock solution obtained by mixing 1.0 ml of 50% hydrofluoric acid and 1.0 ml of 70% nitric acid, instead of the aqueous mixed acid solution used in Example 1, the temperature of the aqueous mixed acid solution was kept at 80° C., and the mixture was subjected to an acid treatment in which the aqueous mixed acid solution was immersed for 30 minutes under stirring at a rotation speed of 300 rpm using a magnetic stirrer.

In the method for manufacturing a phosphor powder composed of the α-sialon phosphor particles of Comparative Example 1, the stock solution concentration of the aqueous mixed acid solution used for the acid treatment was set to a level used in the related art.

Comparative Example 2

A phosphor powder composed of α-sialon phosphor particles of Comparative Example 2 was manufactured by the same procedure as in Example 1, except that the mixture obtained in Example 1 was lightly crushed in a mortar and then ball-milled using a φ1 mm zirconia ball, and an aqueous mixed acid solution having a stock solution concentration of 25% obtained by adding 300 ml of distilled water to a mixed stock solution obtained by mixing 50 ml of 50% hydrofluoric acid and 50 ml of 70% nitric acid, instead of the aqueous mixed acid solution used above, and the phosphor powder was immersed for 60 minutes while the temperature of the aqueous mixed acid solution was kept at 80° C.

(Measurement of Particle Size)

A particle size was measured by a laser diffraction scattering method based on JIS R1629: 1997, using Microtrac MT3300EX II (manufactured by MicrotracBEL Corporation). 0.5 g of a phosphor powder was put into 100 cc of ion exchange water, the mixture was subjected to a dispersion treatment with Ultrasonic Homogenizer US-150E (Nissei Corporation, chip size: φ20 mm, Amplitude: 100%, oscillation frequency: 19.5 KHz, amplitude of vibration: about 31 μm) for 3 minutes, and then the particle size was measured with MT3300EX II. The median diameter ($D_{50}$) was determined from the obtained particle size distribution. In addition, the volume-based cumulative 10% diameter ($D_{10}$) and the volume-based cumulative 90% diameter ($D_{90}$) were each determined, and ($D_{90}$–$D_{10}$)/$D_{50}$ was calculated. The results obtained for the particle size are shown in Table 1.

(Diffuse Reflectance)

The diffuse reflectance was measured by attaching an integrating sphere device (ISV-722) to an ultraviolet-visible spectrophotometer (V-650) manufactured by JASCO Corporation. Baseline correction was performed with a standard reflective plate (Spectralon), a solid sample holder filled with the phosphor powder was attached, and a measurement of the diffuse reflectance with respect to light at each of wavelengths of 500 nm, 600 nm, 700 nm, and 800 nm was performed. The results obtained for the diffuse reflectance are shown in Table 1.

(Light Emission Characteristics)

With regard to each of the obtained phosphor powders, the internal quantum efficiency and the external quantum efficiency were measured by a spectrophotometer (MCPD-7000 manufactured by Otsuka Electronics Co., Ltd.) and calculated by the following procedure.

The phosphor powder was filled so that the surface of a recess cell was smooth, and an integrating sphere was attached. Monochromatic light spectrally split into a wavelength of 455 nm from a light emission source (Xe lamp) was introduced into the integrating sphere using an optical fiber. A sample of the phosphor powder was irradiated with the monochromatic light as an excitation source, and measurement of the fluorescence spectrum of the sample was performed.

A standard reflective plate (Spectralon manufactured by Labsphere Inc.) having a reflectance of 99% was attached to a sample unit, and the spectrum of excitation light at a wavelength of 455 nm was measured. At that time, the number (Qex) of excitation light photons was calculated from a spectrum in the wavelength range of equal to or more than 450 nm and equal to or less than 465 nm.

A phosphor powder composed of the α-sialon phosphor particles was attached to the sample unit, a peak wavelength was determined from the obtained spectral data, and the number (Qref) of reflected excitation light photons and the number (Qem) of fluorescent light photons were calculated. The number of reflected excitation light photons was calculated in the same wavelength range as the number of excitation light photons, and the number of fluorescent light photons was calculated in the range of equal to or more than 465 nm and equal to or less than 800 nm.

Internal quantum efficiency=($Q$em/($Q$ex−$Q$ref))×100

External quantum efficiency=($Q$em/$Q$ex)×100

In a case where the standard sample NSG1301 sold by Sialon Co., Ltd. was measured using the measurement method, the external quantum efficiency was 55.6% and the internal quantum efficiency was 74.8%. The device was calibrated using this sample as a standard. The results obtained for the internal quantum efficiency and the external quantum efficiency are shown in Table 1.

and Experimental Example 2 is an example in which the raw material composition was slightly changed from those of Examples 1 to 4.

Experimental Example 1

In a glove box, 62.4 parts by mass of a silicon nitride powder (manufactured by Ube Kosan Co., Ltd., E10 grade), 22.5 parts by mass of an aluminum nitride powder (manufactured by Tokuyama Corporation, E grade), 2.2 parts by mass of an europium oxide powder (manufactured by Shin-Etsu Chemical Co., Ltd., RU grade), and 12.9 parts by mass of a calcium nitride powder (manufactured by Kojundo Chemical Lab. Co., Ltd.) were used as a blend composition

TABLE 1

| | | | Example 1 | Example 2 | Example 3 | Example 4 | Comparative Example 1 | Comparative Example 2 |
|---|---|---|---|---|---|---|---|---|
| Acid treatment | Acid solution | 50% Hydrofluoric acid (ml) | 3.2 | 1.2 | 10 | 50 | 1.0 | 50 |
| | | 70% Nitric acid (ml) | 0.8 | 2.8 | 10 | 50 | 1.0 | 50 |
| | | Liquid ratio (amount of hydrofluoric acid:amount of nitric acid) | 8:2 | 3:7 | 5:5 | 5:5 | 5:5 | 5:5 |
| | | Distilled water (ml) | 396 | 396 | 380 | 300 | 398 | 300 |
| | | Stock solution concentration (%) | 1.0 | 1.0 | 5.0 | 25 | 0.5 | 25 |
| | Reaction conditions | Temperature (° C.) | 80 | 80 | 30 | 80 | 80 | 80 |
| | | Time (min) | 30 | 30 | 30 | 60 | 30 | 60 |
| Evaluation | Median diameter $D_{50}$ (μm) | | 15.6 | 14.5 | 14.8 | 16.3 | 15.6 | 6.6 |
| | $D_{90}$ | | 27.7 | 25.8 | 26.9 | 29.6 | 27.8 | 13 |
| | $D_{10}$ | | 8.1 | 7.4 | 7.6 | 9.0 | 8.5 | 2.6 |
| | $(D_{90} - D_{10})/D_{50}$ | | 1.3 | 1.3 | 1.3 | 1.3 | 1.2 | 1.6 |
| | Diffuse reflectance (%) | 800 nm | 96.3 | 97.0 | 97.0 | 96.3 | 96.3 | 97.2 |
| | | 700 nm | 95.9 | 96.4 | 96.4 | 95.8 | 95.8 | 96.6 |
| | | 600 nm | 94.8 | 94.8 | 95.1 | 94.8 | 92.6 | 95.6 |
| | | 500 nm | 68.5 | 68.0 | 68.1 | 69.2 | 65.4 | 72.3 |
| | Difference (%) between diffuse reflectance at 800 nm and diffuse reflectance at 600 nm | | 1.5 | 2.2 | 1.9 | 1.5 | 3.7 | 1.6 |
| | Peak wavelength (nm) | | 600 | 600 | 600 | 600 | 600 | 600 |
| | Internal quantum efficiency (%) | | 79.9 | 81.3 | 80.2 | 77.1 | 73.7 | 71.3 |
| | External quantum efficiency (%) | | 71.0 | 70.0 | 71.3 | 67.6 | 65.7 | 58.2 |

As shown in Table 1, it was confirmed that the phosphor powders of Examples 1 to 4 satisfying the conditions that the median diameter ($D_{50}$) was equal to or more than 10 μm and equal to or less than 20 μm and the diffuse reflectance with respect to light at a wavelength of 600 nm was equal to or more than 93% and equal to or less than 99% had improvements in both the internal quantum efficiency and the external quantum efficiency, as compared with Comparative Examples 1 and 2 not satisfying the conditions.

ADDITIONAL EXAMPLES

Additional Examples (Experimental Example 1 and Experimental Example 2 below) show that a phosphor powder having a $D_{50}$ of equal to or more than 10 μm and equal to or less than 20 μm and a diffuse reflectance of equal to or more than 93% and equal to or less than 99% with respect to light at a wavelength of 600 nm has good fluorescence characteristics.

Experimental Example 1 is an example in which the acid treatment was reinforced with respect to Examples 1 to 4, of a raw material powder, and the raw material powders were dry-blended and then passed through a nylon-made sieve having an opening of 250 μm to obtain a raw material mixed powder. A cylindrical boron nitride-made container (manufactured by Denka Co., Ltd., N-1 grade) with a lid, having an internal volume of 0.4 liters, is filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and completely passed through a sieve having an opening of 150 μm to obtain a phosphor powder. With regard to this phosphor powder, the crystal phase was examined by powder X-ray diffraction measurement (X-ray Diffraction) using CuKα rays, and thus, the existing crystal phase was a Ca-α-sialon (α-sialon including Ca) containing an Eu element.

Next, 100 ml of 50% hydrofluoric acid and 100 ml of 70% nitric acid were mixed to obtain a mixed stock solution. 200 ml of distilled water was added to the mixed stock solution, and the concentration of the mixed stock solution was diluted to 50.0% to prepare 400 ml of an aqueous mixed acid solution. 30 g of a phosphor powder composed of the above-mentioned α-sialon phosphor particles was added to the aqueous mixed acid solution, the temperature of the aqueous mixed acid solution was kept at 80° C., and the mixture was subjected to an acid treatment in which the mixture was immersed for 30 minutes under stirring at a rotation speed of 450 rpm using a magnetic stirrer. The powder after the acid treatment was thoroughly washed with distilled water, filtered, dried, and then passed through a sieve having an opening of 45 μm to manufacture a phosphor powder composed of the α-sialon phosphor particles of Example 1.

Experimental Example 2

In a glove box, 62.8 parts by mass of a silicon nitride powder (manufactured by Ube Kosan Co., Ltd., E10 grade), 22.7 parts by mass of an aluminum nitride powder (manufactured by Tokuyama Corporation, E grade), 1.1 parts by mass of an europium oxide powder (manufactured by Shin-Etsu Chemical Co., Ltd., RU grade), and 13.4 parts by mass of a calcium nitride powder (manufactured by Kojundo Chemical Lab. Co., Ltd.) were used as a blend composition of a raw material powder, and the raw material powders were dry-blended and then passed through a nylon-made sieve having an opening of 250 μm to obtain a raw material mixed powder. A cylindrical boron nitride-made container (manufactured by Denka Co., Ltd., N-1 grade) with a lid, having an internal volume of 0.4 liters, is filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and completely passed through a sieve having an opening of 150 μm to obtain a phosphor powder. With regard to this phosphor powder, the crystal phase was examined by powder X-ray diffraction measurement (X-ray Diffraction) using CuKα rays, and thus, the existing crystal phase was a Ca-α-sialon (α-sialon including Ca) containing an Eu element.

Next, 3.2 ml of 50% hydrofluoric acid and 0.8 ml of 70% nitric acid were mixed to obtain a mixed stock solution. 396 ml of distilled water was added to the mixed stock solution, and the concentration of the mixed stock solution was diluted to 1.0% to prepare 400 ml of an aqueous mixed acid solution. 30 g of a phosphor powder composed of the above-mentioned α-sialon phosphor particles was added to the aqueous mixed acid solution, the temperature of the aqueous mixed acid solution was kept at 80° C., and the mixture was subjected to an acid treatment in which the mixture was immersed for 30 minutes under stirring at a rotation speed of 450 rpm using a magnetic stirrer. The powder after the acid treatment was thoroughly washed with distilled water, filtered, dried, and then passed through a sieve having an opening of 45 μm to manufacture a phosphor powder composed of the α-sialon phosphor particles of Example 1.

The particle size, the diffuse reflectance, and the light emission characteristics of the obtained phosphor powder were measured in the same manner as in Examples 1 to 4.

The information on Experimental Examples 1 and 2 is summarized in Table 2 below.

TABLE 2

| | | | Example 1 | Example 2 |
|---|---|---|---|---|
| Acid treatment | Acid solution | 50% Hydrofluoric acid (ml) | 100 | 3.2 |
| | | 70% Nitric acid (ml) | 100 | 0.8 |
| | | Liquid ratio (amount of hydrofluoric acid:amount of nitric acid) | 5:5 | 8:2 |
| | | Distilled water (ml) | 200 | 396 |
| | | Stock solution concentration (%) | 50.0 | 1.0 |
| | Reaction conditions | Temperature (° C.) | 80 | 80 |
| | | Time (min) | 30 | 30 |
| Evaluation | Median diameter $D_{50}$ (μm) | | 15.6 | 15.8 |
| | $(D_{90} - D_{10})/D_{50}$ | | 1.3 | 1.1 |
| | Diffuse reflectance (%) | 800 nm | 98.8 | 99.1 |
| | | 700 nm | 98.5 | 98.8 |
| | | 600 nm | 97.7 | 98.1 |
| | | 500 nm | 76.0 | 76.3 |
| | Difference (%) between diffuse reflectance at 800 nm and diffuse reflectance at 600 nm | | 1.1 | 1.0 |
| | Peak wavelength (nm) | | 600 | 595 |
| | Internal quantum efficiency (%) | | 81.9 | 83.2 |
| | External quantum efficiency (%) | | 66.1 | 71.0 |

From the results of the Additional Examples, it is understood that the diffuse reflectance can be adjusted up to a value close to 99% by changing the conditions of the acid treatment by high-speed stirring and changing the composition. In addition, the fluorescence characteristics of the phosphor powder thus obtained are good.

(Additional Experiments on Change in Acid Treatment Conditions and Accompanying Change of Final Product)

A phosphor powder composed of the α-sialon phosphor particles was manufactured in the same manner as in Example 2, except that the stirring speed by the magnetic stirrer was changed from 450 rpm to 200 rpm which was a level normally used in the related art in Example 2. With regard to this phosphor powder, the particle size measurement, the diffuse reflectance measurement, and the light emission characteristics were evaluated in the same manner as in Examples 1 to 4. The evaluation results and the like are shown in the table below together with Example 2.

TABLE 3

| | | | Example 2 | Present additional experiment |
|---|---|---|---|---|
| Acid treatment | Acid solution | 50% Hydrofluoric acid (ml) | | 1.2 |
| | | 70% Nitric acid (ml) | | 2.8 |
| | | Liquid ratio (amount of hydrofluoric acid:amount of nitric acid) | | 3:7 |

TABLE 3-continued

|  |  | Example 2 | Present additional experiment |
|---|---|---|---|
|  | Distilled water (ml) | 396 |  |
|  | Stock solution concentration (%) | 1.0 |  |
| Reaction conditions | Temperature (° C.) | 80 |  |
|  | Time (min) | 30 |  |
|  | Stirring rotation speed (rpm) | 450 | 200 |
| Evaluation | Median diameter $D_{50}$ (μm) | 14.5 | 14.5 |
|  | $D_{90}$ | 25.8 | 26.3 |
|  | $D_{10}$ | 7.4 | 6.9 |
|  | $(D_{90} - D_{10})/D_{50}$ | 1.3 | 1.3 |
| Diffuse reflectance (%) | 800 nm | 97.0 | 96.6 |
|  | 700 nm | 96.4 | 96.1 |
|  | 600 nm | 94.8 | 93.5 |
|  | 500 nm | 68.0 | 66.9 |
|  | Difference (%) between diffuse reflectance at 800 nm and diffuse reflectance at 600 nm | 2.2 | 3.1 |
|  | Peak wavelength (nm) | 600 | 600 |
|  | Internal quantum efficiency (%) | 81.3 | 75.4 |
|  | External quantum efficiency (%) | 70.0 | 66.6 |

By changing the stirring rotation speed in the acid treatment from 450 rpm in Example 2 to 200 rpm, the diffuse reflectance with respect to light at a wavelength of 600 nm was reduced from 94.8% to 93.5%. In addition, the difference between the diffuse reflectance at 800 nm and the diffuse reflectance at 600 nm increased from 2.2% to 3.1%.

That is, it is understood that a phosphor powder having a large diffuse reflectance with respect to light at a wavelength of 600 nm and/or a small difference between the diffuse reflectance at 800 nm and the diffuse reflectance at 600 nm can be obtained by carefully setting the stirring conditions in the acid treatment from the additional experiments.

This application claims priority based on Japanese Application Japanese Patent Application No. 2019-069116 filed on Mar. 29, 2019, the disclosures of which are incorporated herein by reference in their entireties.

REFERENCE SIGNS LIST

1: α-sialon phosphor particle
30: sealing material
40: composite
100: light-emitting device
120: light-emitting element
130: heat sink
140: case
150: first lead frame
160: second lead frame
170: bonding wire
172: bonding wire

The invention claimed is:

1. A phosphor powder composed of α-sialon phosphor particles containing Eu,
   wherein the α-sialon phosphor particles are composed of an α-sialon phosphor containing an Eu element, represented by General Formula: $(M1_x, M2_y, Eu_z)(Si_{12-(m+n)}Al_{m+n})(O_n N_{16-n})$ (provided that M1 is a monovalent Li element and M2 is a divalent Ca element), and in the general formula, x=0, 0<y<2.0, 0<z≤0.5, 0<x+y, 0.3≤x+y+z≤2.0, 0<m≤4.0, and 0<n≤3.0 are satisfied,
   wherein a light emission peak wavelength is equal to or more than 590 nm,
   wherein a volume-based median diameter ($D_{50}$) determined by a laser diffraction scattering method is equal to or more than 10 μm and equal to or less than 20 μm, and
   a diffuse reflectance with respect to light at a wavelength of 600 nm is equal to or more than 94% and equal to or less than 99%.

2. A phosphor powder composed of α-sialon phosphor particles containing Eu,
   wherein the α-sialon phosphor particles are composed of an α-sialon phosphor containing an Eu element, represented by General Formula: $(M1_x, M2_y, Eu_z)(Si_{12-(m+n)}Al_{m+n})(O_n N_{16-n})$ (provided that M1 is a monovalent Li element and M2 is a divalent Ca element), and in the general formula, x=0,0<y<2.0, 0<z≤0.5, 0<x+y, 1.5≤x+y+z≤2.0, 0<m≤4.0, and 0<n≤3.0 are satisfied,
   wherein a volume-based median diameter ($D_{50}$) determined by a laser diffraction scattering method is equal to or more than 10 μm and equal to or less than 20 μm, and
   a diffuse reflectance with respect to light at a wavelength of 600 nm is equal to or more than 94% and equal to or less than 99%.

3. The phosphor powder according to claim 2,
   wherein a light emission peak wavelength is equal to or more than 590 nm.

4. The phosphor powder according to claim 1,
   wherein a difference (X1−X2) between a diffuse reflectance X1(%) with respect to light at a wavelength of 800 nm and a diffuse reflectance X2(%) with respect to light at a wavelength of 600 nm is equal to or less than 3.0(%).

5. The phosphor powder according to claim 1,
   wherein a diffuse reflectance with respect to light at a wavelength of 500 nm is equal to or more than 66% and equal to or less than 80%.

6. The phosphor powder according to claim 1,
   wherein in a case where a volume-based cumulative 10% diameter and a volume-based cumulative 90% diameter as measured by a laser diffraction scattering method are defined as $D_{10}$ and $D_{90}$, respectively, $(D_{90}−D_{10})/D_{50}$ is equal to or more than 1.0 and equal to or less than 1.5.

7. A composite comprising:
   the phosphor powder according to claim 1; and
   a sealing material that seals the phosphor powder.

8. A light-emitting device comprising:
   a light-emitting element that emits excitation light; and
   the composite according to claim 7, that converts a wavelength of the excitation light.

9. The phosphor powder according to claim 2,
   wherein a difference (X1−X2) between a diffuse reflectance X1(%) with respect to light at a wavelength of 800 nm and a diffuse reflectance X2(%) with respect to light at a wavelength of 600 nm is equal to or less than 3.0(%).

10. The phosphor powder according to claim 2,
    wherein a diffuse reflectance with respect to light at a wavelength of 500 nm is equal to or more than 66% and equal to or less than 80%.

11. The phosphor powder according to claim 2,
    wherein in a case where a volume-based cumulative 10% diameter and a volume-based cumulative 90% diameter as measured by a laser diffraction scattering method are defined as $D_{10}$ and $D_{90}$, respectively, $(D_{90}−D_{10})/D_{50}$ is equal to or more than 1.0 and equal to or less than 1.5.

12. A composite comprising:
the phosphor powder according to claim 2; and
a sealing material that seals the phosphor powder.

13. A light-emitting device comprising:
a light-emitting element that emits excitation light; and
the composite according to claim 12, that converts a wavelength of the excitation light.

* * * * *